United States Patent
Cheng et al.

(10) Patent No.: US 6,952,105 B2
(45) Date of Patent: Oct. 4, 2005

(54) INSPECTION METHOD AND APPARATUS FOR CIRCUIT PATTERN OF RESIST MATERIAL

(75) Inventors: Zhaohui Cheng, Tokyo (JP); Mari Nozoe, Hino (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/620,702

(22) Filed: Jul. 17, 2003

(65) Prior Publication Data

US 2005/0099189 A1 May 12, 2005

(30) Foreign Application Priority Data

Jan. 22, 2003 (JP) ........................................ 2003-013127

(51) Int. Cl.[7] .................... G01R 31/305; G01R 31/302; G01N 23/00
(52) U.S. Cl. ...................... 324/751; 324/750; 250/310; 250/311
(58) Field of Search ................................. 324/750–751; 250/306–307, 310–311; 716/1–21

(56) References Cited

U.S. PATENT DOCUMENTS

| 4,189,641 A | * | 2/1980 | Katagiri et al. ............. 250/311 |
| 5,986,263 A | * | 11/1999 | Hiroi et al. .................. 250/310 |
| 6,184,526 B1 | * | 2/2001 | Kohama et al. ............. 250/310 |
| 6,519,758 B2 | * | 2/2003 | Miyagawa .................... 716/19 |
| 6,563,114 B1 | * | 5/2003 | Nagahama et al. ......... 250/310 |
| 2002/0155378 A1 | * | 10/2002 | Uetani et al. ............. 430/270.1 |
| 2004/0051040 A1 | * | 3/2004 | Nasu et al. .................. 250/310 |

FOREIGN PATENT DOCUMENTS

| JP | 53-030865 | * | 3/1978 | ............ H01J/37/26 |
| JP | 11-160402 A | | 6/1999 | |
| JP | 2000-200579 A | | 7/2000 | |
| JP | 2002-14062 A | | 1/2002 | |

* cited by examiner

*Primary Examiner*—Paresh Patel
(74) *Attorney, Agent, or Firm*—Antonelli, Terry, Stout and Kraus, LLP.

(57) ABSTRACT

A pattern inspecting technique, depending on the kind of materials, can reduce damage including shrinkage to materials when the materials are prone to such damage as shrinkage and spoilage caused by electron beam irradiation. This is accomplished by scanning a sample with a primary electron beam, detecting secondary electrons generated, or electrons reflected from the semiconductor device, or both the former and latter electrons, and converting the electrons into signals, and transforming the signals into an image, displaying the image, and detecting defective spots in the circuit pattern of the sample. The irradiation density (dose per unit area) of the electron beam is monitored and limited depending on the kind of material of the circuit pattern under inspection and the inspecting conditions, and damage, such as shrinkage and spoilage to the materials during electron beam irradiation, is reduced to an allowable range.

12 Claims, 6 Drawing Sheets

<1nm (IMMEASURABLE)

INSPECTION METHOD AND APPARATUS FOR CIRCUIT PATTERN OF RESIST MATERIAL

BACKGROUND OF THE INVENTION

The present invention relates to a technique for inspection of fine circuit patterns on circuit boards for semiconductor devices, liquid crystal displays, and the like, by use of an electron beams.

As an example of the currently available processing, a typical method of inspecting a fine circuit pattern on a wafer (board) will be described.

An integrated circuit is performed by printing patterns, which are formed on photo masks, on a wafer successively by lithography and etching. The yield of ICs produced in this way is affected by errors in the printing patterns, the entry of foreign matters, etc; accordingly, patterns on wafers are inspected in the course of manufacture of the ICs.

Defects of circuit patterns on wafers are mainly detected optically or by using an electron beam. With patterns becoming ever finer and more complex, the shapes becoming ever more complex, and the materials becoming more diversified, it has become more difficult to detect defects by use of optical methods. Under the circumstances, there have been proposed various methods of inspecting such patterns on the basis of their images as reproduced with electron beams, the resolution of which images is higher than that of optical images.

According to some methods that have been proposed, an electron beam is applied to a circuit board to obtain an image of its circuit pattern. When defects are detected, the images are stored and analyzed to determine the kinds of defects automatically (for example, see JP-A No.160402/1999, referred to hereinafter as Patent Document 1).

As an example, a typical existing method of measuring the dimensions of a fine circuit pattern on a wafer will be described. As the circuit patterns of IC's become finer, more strict control of the dimensions and shapes of the circuit patterns on the wafers is required. In this regard, even slight dimensional errors affect the performance of the ICs.

Circuit patterns on wafers are measured optically or by using an electron beam. Electron beams are mainly used for the measurement of holes and the measurement of two-dimensional images. According to some methods that have been proposed, the top surface of the sample under inspection is charged with an electron beam and a first acceleration voltage, and then a second acceleration voltage is applied to the sample to obtain an image for observation (for example, see Patent Document 2: JP-A No.200579/2000, referred to hereinafter as Patent Document 2).

As described above, with use of the technique for inspecting and measuring circuit patterns with electron beams, the quality control, such as the control of dimensions and the detection of defects, under a higher lateral resolution is possible.

The existing inspection apparatuses use a probe current of several tens of nanoamperes and an electron beam that is accelerated in the range from several hundred volts to ten kilovolts, which poses no problems so long as silicon oxide or the like is used for the insulating films between layers. With circuit patterns ever becoming finer and the data-processing speeds of ICs ever increasing, however, it is becoming essential to use porous low-permittivity materials.

Although Patent Documents 1 and 2 claim that the acceleration voltage of an electron beam against a wafer is variable in the range from several hundred volts to ten kilovolts (in the case of an inspection apparatus) and several tens of volts to two kilovolts (in the case of a length-measuring apparatus), they do not mention any technique for inspection and measurement that is capable of reducing damage to resists and porous low-permittivity materials.

As described above, the prior methods hardly address the problem of damage to circuit patterns that is caused by the exposure of the materials thereof to electron beams. Accordingly, when wafers with circuit patterns including resists and porous materials are inspected, the resists and porous materials are damaged and the dimensions of circuit patterns deviate from their design values.

The present inventor et al. have ascertained that when wafers including resists and porous materials are inspected by the existing methods, the following damage occurs to wafers.

(1) Materials are decomposed and shrink. Patterns on wafers change under the exposure to electron beams, and the reliability of measurement is reduced.

(2) Materials are decomposed by exposure to electron beams, which affects their characteristics, such as adhesion to other materials.

The above-described phenomena (1) and (2) lower the yield and the performance of ICs.

SUMMARY OF THE INVENTION

The object of the present invention is to provide a technique that is capable of reducing damage, including shrinkage, to resists and porous low-permittivity materials that are included in fine patterns on wafers, while they are being inspected with an electron beam.

The foregoing object of the present invention can be achieved by optimizing the irradiation energy of an electron beam and limiting its irradiation density.

According to a study by the present inventor et al., the damage, such as shrinkage and spoilage, to a resist or porous low-permittivity material in a circuit board, which is caused by an electron beam, largely depends on the acceleration voltage of the electron beam relative to the board and the incident density of the beam into the board. The present inventor took porous low-permittivity materials (for example, porous low-permittivity hydrogensilsesquioxane (HSQ) materials) as examples and studied their shrinkage due to exposure to an electron beam; and, it was found that, as the irradiation energy of the electron beam increased, the shrinkage increased, indicating a strong dependency on irradiation energy, and that the shrinkage tended to saturate as the irradiation density of an electron beam increased. Thus, the present invention is based on the new knowledge that the irradiation energy and density of an electron beam govern the damage to porous materials.

The present inventor et al. studied the shrinkage of the above-mentioned porous low-permittivity materials under conditions of changing probe current and changing irradiation density of an electron beam, and it was found that the shrinkage hardly changed while the irradiation density was kept constant and the probe current was increased 5,000 times within the range of the study. Thus, the present inventor et al. have determined that the damage to a circuit pattern due to exposure to a primary electron beam could be reduced to an allowable range, regardless of the probe current of the beam, by controlling the irradiation energy and density of the beam.

The damage to a porous material due to exposure to an electron beam is caused by direct action between incident electrons and bonding electrons in the material, or by thermal decomposition due to incident energy which raises the surface temperature of the sample. The present inventor et al. found that the former cause was predominant over the latter one, while the probe current of the electron beam was kept constant.

The lower the irradiation energy of the primary electron beam is, the shallower the incidence of the beam is and thus the smaller the area of damage due to exposure to the beam is. Besides, the efficiency of destruction by an incident electron beam can be considered dependent on the irradiation energy of the beam.

Accordingly, damage, such as shrinkage and spoilage to resists and porous low-permittivity materials during inspection and length measuring, can be reduced by reducing the irradiation energy and density of the primary electron beam. The control of the irradiation density of an electron beam can be accomplished by adjusting the probe current the scanning area, the scanning speed, and the number of times of scanning by the beam.

Now a typical configuration, which may be used to carry out the method for inspecting circuit patterns according to the present invention, will be described.

(1) According to the invention, there is provided a method of inspecting a board with a circuit pattern including at least a porous low-permittivity material (for example, a porous low-permittivity hydrogensilsesquioxane material), or a material similar to it in terms of structure or composition. The method comprises a step of scanning the circuit pattern with a primary electron beam; a step of detecting secondary electrons generated, or the electrons reflected from the board due to the irradiation, or both the former and latter electrons, and converting the electrons into signals; and a step of transforming the signals into an image, displaying the image, and inspecting the circuit pattern. Damage, including shrinkage, to the circuit pattern by the primary electron beam is reduced by controlling the irradiation energy and density of the primary electron beam.

(2) According to the invention, there is provided the method of the above paragraph (1), wherein the shrinkage of the circuit pattern due to exposure to the primary electron beam is reduced to 2.4 nm or less by setting the irradiation energy of the primary electron beam to 300 eV or less.

(3) According to the invention, there is provided the method of the above paragraph (1), wherein the irradiation density of the primary electron beam is limited according to the irradiation energy of the primary electron beam and depending on the kind of said low-permittivity material or said similar material.

(4) According to the invention, there is provided the method of the above paragraph (1), which further comprises a step of recording the irradiation history of the board, such as the irradiation energy, the probe current, and the irradiation density of the primary electron beam and the areas of the circuit pattern to be exposed to the primary electron beam.

(5) According to the invention, there is provided the method of the above paragraph (1), which further comprises a step of finding, in advance, for each material included in the board, the correlations between (i) parameters including the irradiation energy, probe current, and irradiation density of the primary electron beam, and (ii) dimensional changes of the circuit pattern; and a step of adjusting at least one of the parameters before the circuit pattern is scanned with the primary electron beam.

(6) According to the invention, there is provided the method of the above paragraph (1), wherein the irradiation density of the primary electron beam is controlled by (i) calculating, in advance, the maximum dose of irradiation per unit area in each area of the circuit pattern to be exposed to the primary electron beam, and (ii) limiting the irradiation density of the primary electron beam to a value below the maximum dose of irradiation in said area during the inspection of the board.

(7) According to the invention, there is provided a method of inspecting a board with a circuit pattern including at least a porous low-permittivity material (for example, a porous low-permittivity hydrogensilsesquioxane material), or a material similar to it in terms of structure or composition. The method comprises a step of scanning the circuit pattern with a primary electron beam; a step of detecting the secondary electrons generated, or the electrons reflected from the board due to the irradiation, or both the former and latter electrons, and converting the electrons into signals; and a step of transforming the signals into an image, displaying the image, and inspecting the circuit pattern. The shrinkage of the circuit pattern due to the exposure to the primary electron beam is reduced to 2.4 nm or less by setting the irradiation energy of the primary electron beam to 300 eV or less.

(8) According to the invention, there is provided a method of inspecting a board with a circuit pattern including at least a porous low-permittivity material (for example, a porous low-permittivity hydrogensilsesquioxane material), or a material similar to it in terms of structure or composition. The method comprises a step of scanning the circuit pattern with a primary electron beam; a step of detecting the secondary electrons generated, or the electrons reflected from the board due to the irradiation, or both the former and latter electrons, and converting the electrons into signals; and a step of transforming the signals into an image, displaying the image, and inspecting the circuit pattern. The shrinkage of the circuit pattern due to the exposure to the primary electron beam is reduced to 2.4 nm or less by (i) setting the irradiation energy of the primary electron beam to 300 eV or less, or (ii) setting the irradiation density of the primary electron beam to 1.4 $C/m^2$, if the irradiation energy of the primary electron beam is about 800 eV or more.

(9) According to the invention, there is provided an apparatus for inspecting a board with a circuit pattern. At least the areas of the circuit pattern to be exposed to a primary electron beam include at least a porous low-permittivity material (for example, a porous low-permittivity hydrogensilsesquioxane material), or a material similar to it in terms of structure or composition. The apparatus comprises a means for scanning the circuit pattern with the primary electron beam; a means for detecting the secondary electrons generated, or the electrons reflected from the board due to the irradiation, or both the former and latter electrons, and converting the electrons into signals; and a means for transforming the signals into an image, displaying the image, and inspecting the circuit pattern. Damage, including shrinkage, to the circuit pattern by the primary electron beam is reduced by controlling the irradiation energy and density of the primary electron beam. Besides, the shrinkage of the circuit pattern due to the exposure to the primary electron beam is reduced to 2.4 nm or less by setting the irradiation energy of the primary electron beam to 300 eV or less.

(10) According to the invention, there is provided a method of inspecting a semiconductor device with a primary electron beam. The method comprises a step of scanning the circuit pattern of the board of the semiconductor device with the primary electron beam; a step of detecting the secondary electrons generated, or the electrons reflected from the board due to the irradiation, or both the former and latter electrons and converting the electrons into signals; and a step of transforming the signals into an image and displaying the image. Before the fine circuit pattern of the integrated circuit is inspected with the primary electron beam, (i) the various conditions (including the irradiation energy and the probe current of the beam, and the magnifying power for observation) of irradiation are set, (ii) the materials included in the circuit pattern are identified, and (iii) the allowable level of damage to the materials is set. Then, the maximum irradiation density to each inspection area of the circuit pattern is controlled on the basis of data on the correlations between (i) the irradiation conditions and the allowable damage level.

The above data are quantitative ones on the correlations between (i) the change of damage to a resist or porous low-permittivity material and (ii) the irradiation energy, the probe current, and irradiation density of the primary electron beam.

Preferably, included in the method of the above paragraph (10) are a step of registering the data on correlations and a step of providing an optimal number of times of irradiation.

(11) According to the invention, there is provided a method of inspecting a semiconductor device with a primary electron beam. The method comprises a step of scanning the circuit pattern of the board of the semiconductor device with the primary electron beam; a step of detecting the secondary electrons generated, or the electrons reflected from the board due to the irradiation, or both the former and latter electrons, and converting the electrons into signals; and a step of transforming the signals into an image and displaying the image. The integrated-circuit board includes at least a porous low-permittivity hydrogensilsesquioxane material, or a material similar to it in terms of structure or composition. The shrinkage of the circuit pattern due to the exposure to the primary electron beam is reduced to 2.4 nm or less by (i) setting the irradiation energy of the primary electron beam to 300 eV or less, or (ii) setting the irradiation density of the primary electron beam to 1.4 $C/m^2$ or less, if the irradiation energy of the primary electron beam is about 800 eV or more.

(12) According to the invention, there is provided a method of inspecting a semiconductor device with a primary electron beam. The method comprises a step of scanning the circuit pattern of the board of the semiconductor device with the primary electron beam; a step of detecting the secondary electrons generated, or the electrons reflected from the board due to the irradiation, or both the former and latter electrons, and converting the electrons into signals; and a step of transforming the signals into an image and displaying the image. The method further comprises a step of (i) loading the integrated-circuit board, (ii) displaying a picture to set the conditions of inspection to be outputted, (iii) inputting parameters including the kind of the resist or low-permittivity material included in the board, the irradiation energy and probe current of the primary electron beam used in the inspection, and the magnifying power for observation, (iv) displaying the maximum number of times of irradiation at an inspection area on the circuit pattern, and (v) setting the actual number of times of irradiation.

The inspection technique of the present invention has the following advantages over presently available methods and apparatus.

(1) By setting the rated irradiation energy of a primary electron beam to 20–500 eV for porous materials, the damage can be reduced to such a degree that the damage can be ignored even in the case of integrated-circuit boards with nodes of 100 nm or less. Accordingly, integrated-circuit boards comprising materials that are unstable under irradiation, such as porous materials, can be inspected without damaging them, which the existing inspection apparatus (their irradiation energy is over 300 eV) are not capable of.

(2) Because the irradiation energy is low, only signals of secondary electrons being emitted and electrons that are reflected from the surface of a sample are detected, without the results being affected by secondary electrons being emitted or electrons that are reflected form below the surface. Thus, the dimensions and shapes of circuit patterns can be inspected with a higher precision.

With the technique of the present invention, the electro-optical system and other systems of an inspection apparatus are designed so that an optimal performance (for example, the diameter of the electron beam is minimized) can be derived with an irradiation energy of 300 V. Thus, measurement and observation with a higher precision can be realized.

The rated irradiation energy of the existing methods of inspecting circuit patterns with an electron beam is 500 eV or more (including length measurement). If a porous material is exposed to an electron beam of typical irradiation density, a shrinkage of 10 nm or so occurs. With the technique of the present invention, however, the shrinkage of porous materials can be reduced to 1–2 nm by setting the irradiation energy of an electron beam to 300 eV or limiting the irradiation density of the beam. Thus, with the technique of the present invention, integrated-circuit boards, which include porous materials, and of which the nodes are 100 nm or less, can be inspected.

DESCRIPTION OF THE PREFERRED EMBODIMENTS

Referring to the drawings, various embodiments of a method and apparatus for inspecting circuit patterns in accordance with the present invention will be described in detail.

First Embodiment

Figure 1:
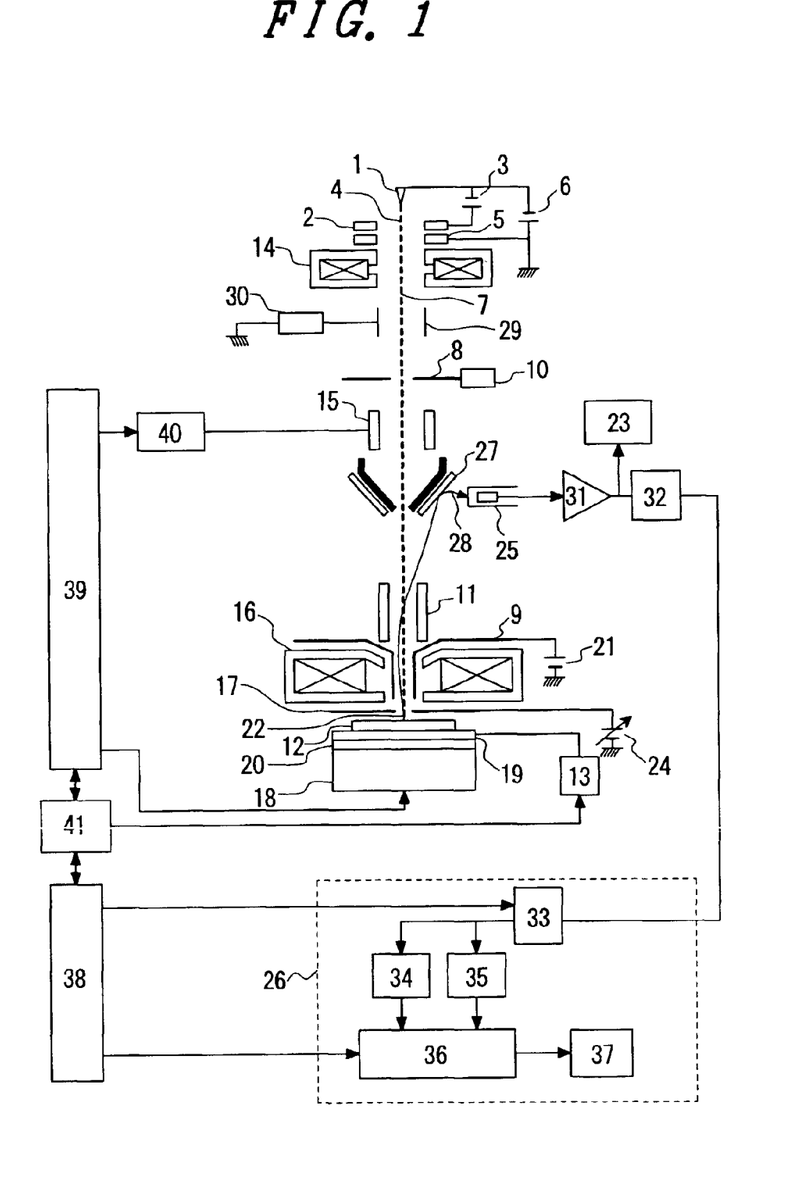
FIG. 1 is a schematic diagram of a retarding-type scanning inspection apparatus using electron-beam irradiation according to the present invention.

FIG. 1 is a schematic illustration of a typical retarding-type scanning inspection apparatus which uses electron-beam irradiation. The object of the present invention is to control the integrated number of times of irradiation of a primary electron beam at each inspection area of a circuit pattern, based on the irradiation energy and probe current of the beam, the magnifying power for observation, and the scanning rate employed during inspection, depending on the kinds of resists or the kinds of porous, low-permittivity materials present in the circuit pattern, in order to prevent or reduce the damage to circuit patterns by irradiation of the primary electron beam.

The irradiation energy directed toward a semiconductor device (or an integrated-circuit board) under inspection can be changed by the ordinary method of changing the acceleration voltage of electrons emitted from the electron gun. In accordance with the present invention, however, embodiments which involve the use of a retarding-type inspection apparatus employing electron-beam irradiation will be described.

When an extraction voltage 3 is applied between a field-emission cathode 1 and an extractor 2, electrons 4 are emitted. Emitted electrons 4 are accelerated (or decelerated) between the extractor 2 and an anode 5, which is at ground potential. The acceleration voltage of the resulting electron beam (primary electron beam) 7, formed of electrons which have passed the anode 5, corresponds to the accelerating voltage of the electron gun.

The primary electron beam 7, which is accelerated by the anode 5, undergoes scanning deflection by a condenser lens 14 and a scanning deflector 15. The deflecting intensity of the scanning deflector 15 is varied to produce two-dimensional scanning of the top surface of a sample 12 with the focus at the center of an objective lens 16. The defected primary electron beam 7 is accelerated by a post-deflection acceleration voltage 21 applied by an accelerating cylinder 9 that is provided in a passage of the objective lens 16. The primary electron beam 7, after the post-deflection acceleration, is focused on the sample 12 by the objective lens 16. A generator 13 generates a negative retarding voltage, which is applied to the sample 12 to form a deceleration field between the objective lens 16 and the sample 12. After passing through the objective lens 16, the primary electron beam 7 is decelerated by the deceleration field and reaches the sample 12.

With the configuration described above, the acceleration voltage of the primary electron beam 7, at the time that it passes through the objective lens 16, is the sum of the acceleration voltage 6 of the electron gun and the post-deflection acceleration voltage 21, which is higher than the acceleration voltage at the time of incidence of the beam 7 into the sample 12 (the acceleration voltage 6 of the electron gun minus the retarding voltage 13). Accordingly, a finer electron beam (high spatial resolution) is obtained, compared with the primary electron beam 7 that is focused by the objective lens 16 under the acceleration voltage at the time of incidence of the beam 7 into the sample 12. This is accomplished by a reduced chromatic aberration of the objective lens 16. If the acceleration voltage 6 of the electron gun is 10 kV, the post-deflection acceleration voltage 21 is 8 kV, and the retarding voltage is 9.7 kV, the primary electron beam 7 passes through the objective lens 16 under an acceleration voltage of 18 kV, and the irradiation energy of the primary electron beam 7 at the time of incidence is 300 eV. The spatial resolution in this example is about 2.5 nm, whereas the resolution is 10 nm, if the primary electron beam 7 with irradiation energy of 1 keV is focused by the objective lens 16.

To accomplish damage-free inspection of resists or porous-type materials, the irradiation energy has to be reduced to 300 eV or less, or the irradiation density has to be limited. A high spatial resolution of, for example, 3 nm or less, with an irradiation energy of 300 eV, can be obtained with the above setting.

When the primary electron beam 7 is applied to the sample 12, secondary signals 22 are generated. The secondary signals 22 to be used consist of secondary electrons and reflected electrons. The electric field formed between the objective lens 16 and the sample 12 acts on the secondary signals 22 as an acceleration field; therefore, the secondary signals 22 are attracted into the passage of the objective lens 16 and rise through the passage under the action of the objective 16. After passing through the passage, the secondary signals 22 pass through the ExB deflector 11 and collide with a reflector 27. The reflector 27 is a conductive plate, and it has an opening in its center to let the primary electron beam 7 pass there-through. The collision surface of the reflector 27 is coated with a material that is highly generative of secondary electrons, such as gold. This material is coated on the surface of the reflector 27 by the vapor deposition method. The secondary electrons and reflected electrons of secondary signals 22 collide with the reflector 27 through almost the same path.

The secondary and reflected electrons of secondary signals 22 collide with the reflector 27 to generate secondary electrons 28, which are detected and converted into electrical signals by a secondary-electron detector 25 and are amplified by a preamplifier 31. A monitor 23 undergoes brilliance modulation in response to the output signals of the preamplifier 31 to produce a two-dimensional image that is synchronous with the primary electron beam 7. Alternatively, the output signals of the preamplifier 31 may be converted into digital signals by an analog-digital converter 32, after which the digital signals are sent through a buffer 33 to an image storage 34 or 35. The secondary-electron detector 25 may be a semiconductor detector or an MCP (micro-channel plate). The images stored in the image storage 34 and 35 are sent through an image processor 36 to a defect detector 37, where the kinds and locations of defects are determined and recorded.

If the irradiation energy of the primary electron beam 7 is reduced to, for example, 300 eV or less, the control of electrification of the top surface of the sample 12 becomes more difficult. To cope with this problem, an electrification-controlling electrode 17 is provided between the objective lens 16 and the sample 12. A power supply 24 applies an appropriate voltage to the electrification-controlling electrode 17 to form an appropriate electric field between the objective lens 16 and the sample 12, thereby to control the quantity of the secondary signals 22 returning to the sample 12. Thus, the electrification potential of the top surface of the sample 12 can be precisely controlled.

The output signals of the secondary-electron detector 25 are synchronized with the scan signals of the primary electron beam 7, which are used to display an image on an electron-beam scan image display and store the image in the data-processing unit 26, including the storages. The data-processing unit 26 processes the image and determines and records the shapes and dimensions of the image.

An aperture diaphragm 8 is provided to control the opening angle of the primary electron beam 7, and an adjusting knob 10 is provided to align the aperture diaphragm 8 with the vertical center axis of the inspection apparatus. The reference numeral 18 indicates a mechanism for moving the sample 12 in the X and Y directions. An insulating plate 20 is provided on the mechanism 18. On the insulating plate 20, there is a sample holder 19, to which the retarding voltage 13 is applied. When a sample 12 is placed on the sample holder 19, the retarding voltage 13 is applied to the sample 12, as well. The reference numeral 29 indicates a blanker. By applying a blanking voltage 30 to the blanker 29, the primary electron beam 7 is deflected for collision with the aperture diaphragm 8; accordingly, when this occurs, the primary electron beam 7 can be controlled so as to be prevented from reaching the sample 12. Thus, the primary electron beam 7 is applied to the sample 12 only during the observation and irradiation of the sample 12. For example, while the conditions of irradiation are calculated and set, the primary electron beam 7 is prevented from reaching the sample 12; and, hence, the irradiation density of the primary electron beam 7 can precisely be controlled.

Figure 2:
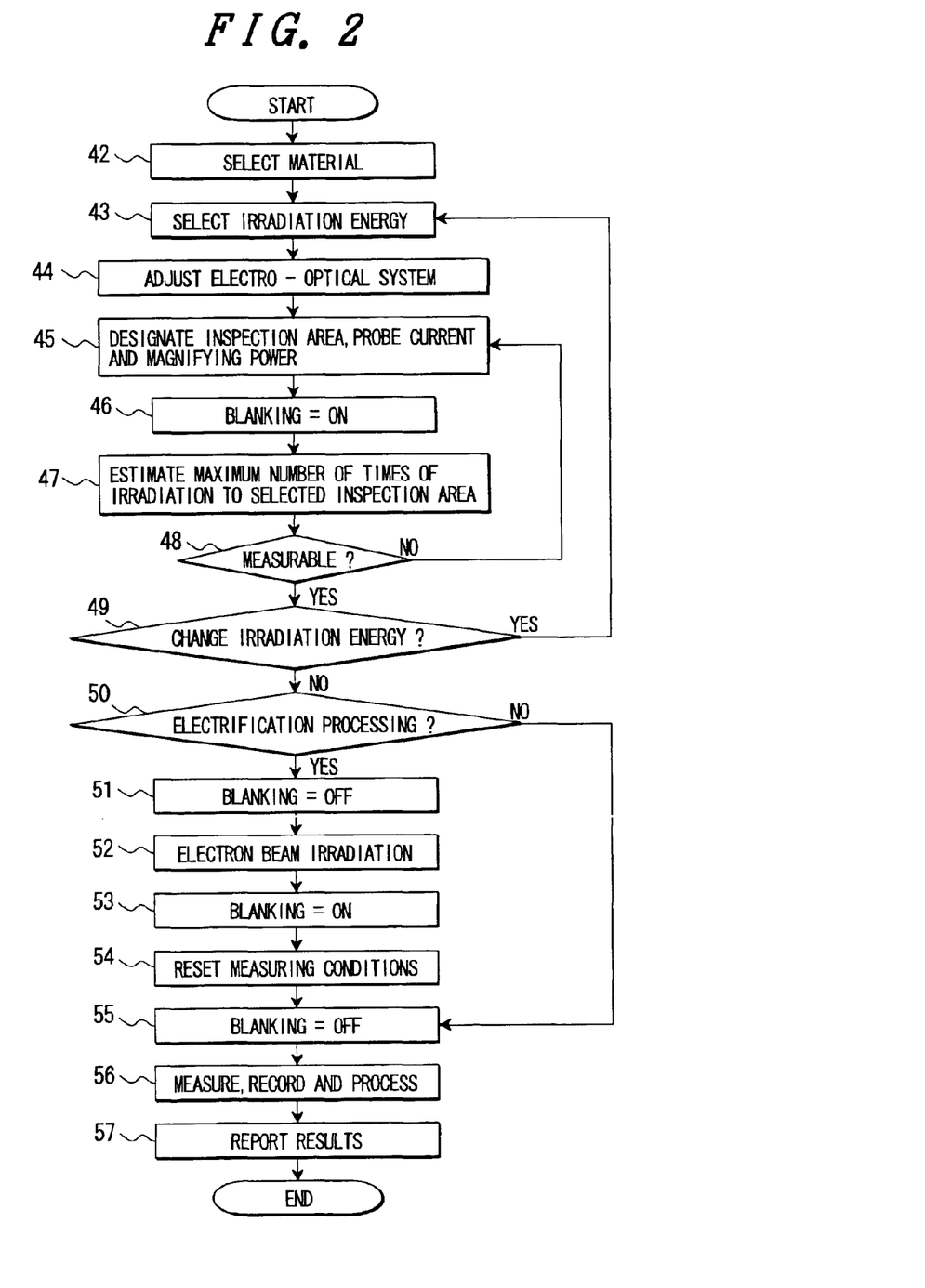
FIG. 2 is a flowchart of the processing performed according to a first embodiment of the present invention.

Referring to the flowchart of FIG. 2, a damage-free method of inspecting porous, low-permittivity materials according to the present embodiment will be described.

Referring to a database, the kind of a resist or low-permittivity material included in an integrated-circuit board is designated (Step 42), and then an irradiation energy capable of damage-free inspection (Step 43) is selected. The electro-optical system is adjusted with the selected irradiation energy (Step 44). Referring to the optical or electro-beam scan image of the circuit pattern, an inspection area and the magnitude of the probe current of the electron beam to be used for inspection are specified, and the magnifying power for observation of the area is determined (Step 45).

In Step 45, the image (image "A") is stored in a storage, if necessary.

Thereafter, the primary electron beam 7 is interrupted using the blanker 29 (Step 46); and, the maximum number of times of irradiation is estimated at each inspection area, and the locations of irradiation and the maximum number of times of irradiation are stored in a storage (Step 47).

If the estimated number of times of irradiation is smaller than the minimum number of times of irradiation required to obtain an SEM (scanning electron microscope) image with a sufficient signal-to-noise ratio, the measurement is deemed to be impossible (Step 48). In this case, the system returns to Step 45 to specify an inspection area, probe current, and magnifying power again, and Steps 44–48 are repeated. If the measurement is possible in Step 48, the system advances to Step 49; wherein, if it is necessary to change the irradiation energy, the system returns to Step 43 and Steps 43–49 are repeated.

If it is not necessary to change the irradiation energy in Step 49, it is determined whether a charging process to raise the yield of secondary signals is necessary (Step 50). If the processing is not necessary, the blanker 29 is turned off (Step 55), the inspection area is measured at the specified magnifying power (image "B") (Step 56), and the result is reported (Step 57).

If a primary electron beam 7 with higher irradiation energy is applied to a sample 12 for higher spatial resolution, the irradiation density of the beam 7 is limited so as to reduce damage to the sample 12.

If the top surface of the sample 12 has to be charged before inspection, the primary electron beam 7 is set to an appropriate level of irradiation energy, and the charging process is carried out (Steps 51–53).

The irradiation density values of all of the spots of the inspection area are added up, and the measuring time is set so that the irradiation will not exceed its upper limit.

The dimensions and shapes of the circuit pattern are measured and checked on the image "B". If the inspection apparatus is automatically operated, data on the inspection area and conditions of inspection may be read from a database without manual observation, and an image "B" of the inspection area may be directly recorded. The results of measurement and checkups of dimensions and shapes on the image "B" are compared with data in the database for judgment.

Thereafter, the system moves to another inspection area, and the above-described process is repeated. The above-described process is stored as a program in the system, and the program is executed.

Second Embodiment

Figure 3:
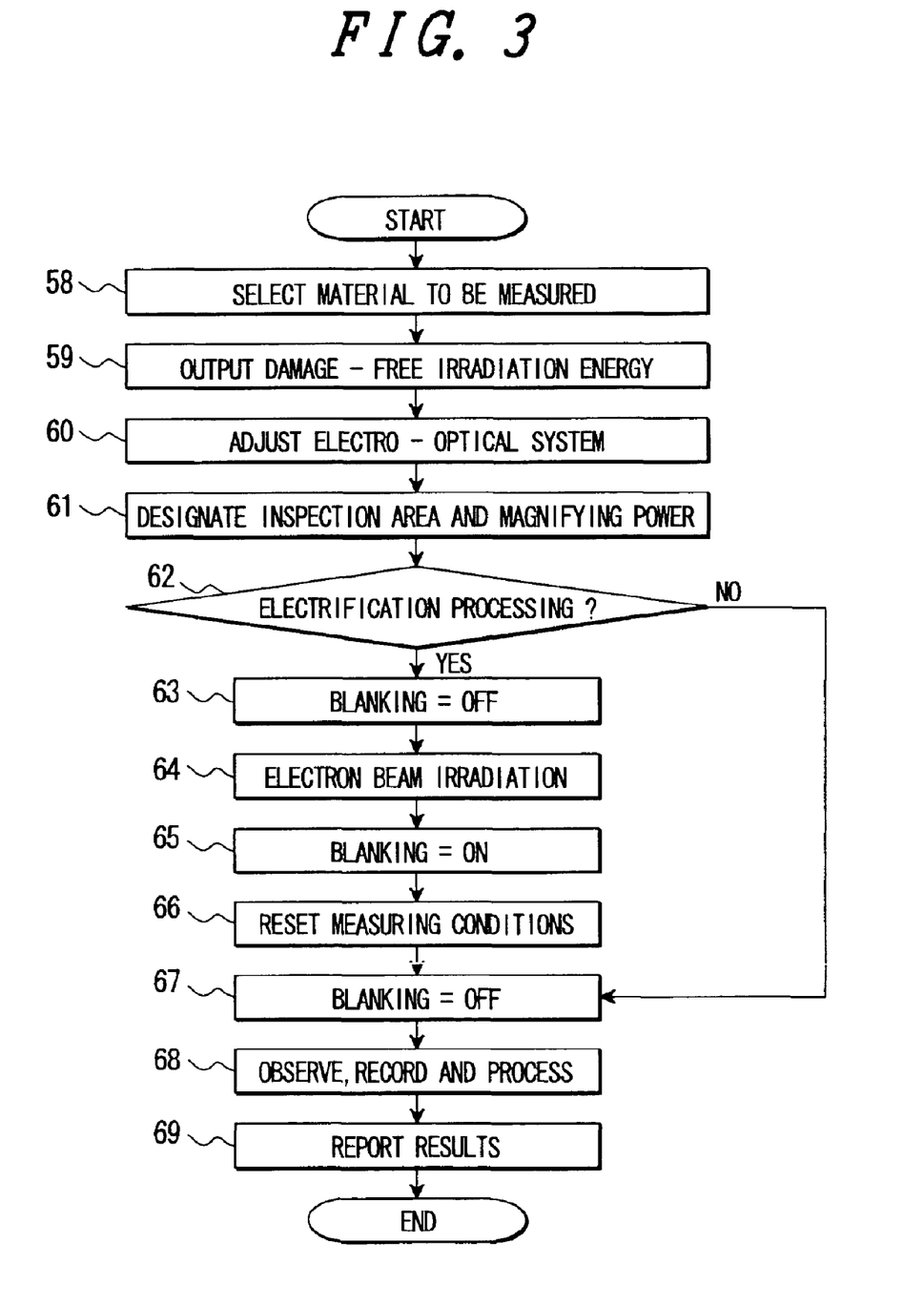
FIG. 3 is a flowchart of the processing performed according to a second embodiment of the present invention.

Referring the flowchart of FIG. 3, a second embodiment of the damage-free inspection method according to the present invention will be described. Since the configuration of the inspection apparatus for this second embodiment is the same as that for the first embodiment, a repeated description of the apparatus will be omitted here.

The shrinkage of porous low-permittivity HSQ materials under irradiation tends to saturate as the irradiation density of the primary electron beam increases. If the irradiation energy of the primary electron beam is sufficiently low, monitoring of the irradiation density of the primary electron beam during inspection is unnecessary, so long as the effects on the performance and yield of the integrated-circuit boards are at such an insubstantial level that they can be ignored if the shrinkage of a porous material becomes steady.

In this embodiment, by designating the kind of porous material included in the sample 12 (Step 58), such damage-free irradiation energy is provided (Step 59). Thereafter, as in the case of the first embodiment, the electro-optical system is adjusted with the selected damage-free irradiation energy (Step 60), and while looking at the scan image of the sample, the operator marks an inspection area and determines the magnifying power for the observation of the area (Step 61).

Then, the dimensions and shapes of the circuit pattern in the inspection area are manually or automatically measured and checked and the results are stored. As in the case of the first embodiment, if the top surface of the sample 12 has to be charged before measurement, the charging process is carried out (Step 63–65).

Third Embodiment

Figure 4:
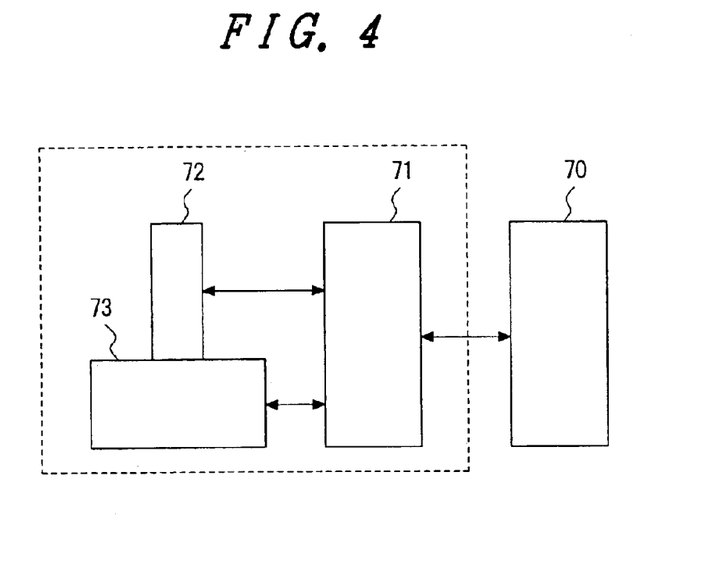
FIG. 4 is a block diagram of a third embodiment of the present invention.

Referring to FIG. 4, a third embodiment of the method of inspecting a circuit pattern of an integrated-circuit board, including a resist or a porous material, will be described. The inspection apparatus used in this third embodiment is similar to that used in the first embodiment, and it is represented by the sections surrounded by the broken line of FIG. 4. The reference numerals 71, 72, and 73 are a control system, a body tube, and a wafer chamber including a stage, respectively.

Data including information on the inspection areas of the circuit pattern at a manufacturing step are read in advance into the measuring apparatus from another storage 70, including a database of the circuit patterns of the manufacturing steps of the integrated circuit board. When an inspection area of the circuit pattern is selected from the data, the measuring apparatus directly generates an electron-beam scan image of the inspection area and measures the dimensions and shapes of the circuit pattern on the image. Thus, irradiation can be confined to inspection areas; and, hence, the damage to the board due to the inspection can be minimized. The process of inspection is similar to the methods employed in the first and second embodiments (FIGS. 2 and 3). As to the information on inspection areas of the circuit patterns of manufacturing steps of the integrated-circuit board, data obtained by other measuring apparatuses may be read into the above-described measuring apparatus.

Figure 5A:
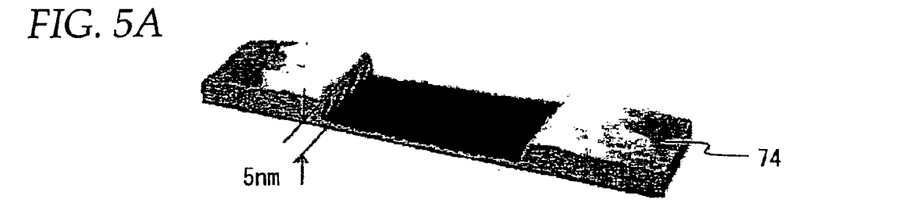
FIG. 5A is a microscopic image which shows the shrinkage of a XLK film, to which an electron beam was applied by using the apparatus of FIG. 1 and the existing electron-beam method of inspecting circuit patterns.
Figure 5B:
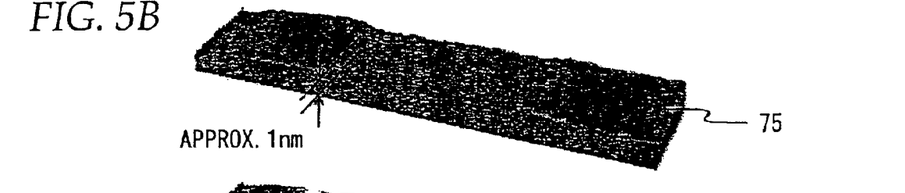
FIGS. 5B and 5C are microscopic images which show the shrinkage of XLK film, to which an electron beam was applied by using the same apparatus and methods of inspecting circuit patterns according to the present invention.
Figure 5C:
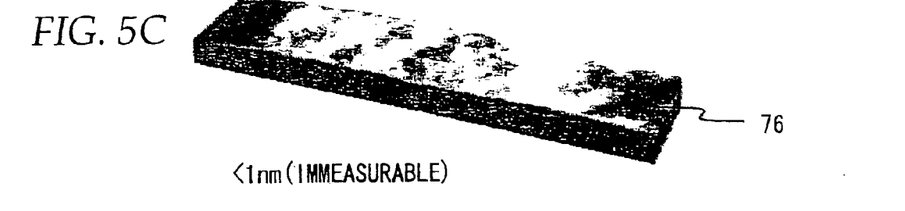

FIG. 5A shows the shrinkage of a XLK film to which an electron beam was applied by using the apparatus of FIG. 1, using the existing electron-beam method of inspecting circuit patterns. FIGS. 5B and 5C show the shrinkage of a XLK film to which an electron beam was applied by using the same apparatus, but this time with methods of inspecting circuit patterns according to the present invention. The measurements shown in those figures were taken with an AFM (atomic force microscope).

The irradiation density is the same (17.7 C/cm$^2$) in the three cases. The shrinkage was about 5 nm in the case of the existing method (the irradiation energy was 800 eV) as shown in FIG. 5A; whereas, the shrinkage hardly occurred in the cases of the methods of the present invention (the irradiation energy was 300 eV and 200 V, respectively), as shown in FIGS. 5B and 5C. Thus, the methods of the present invention proved to be capable of reducing damage, such as dimensional variation of circuit patterns, due to an inspection in which an electron beam is used.

Figure 6A:
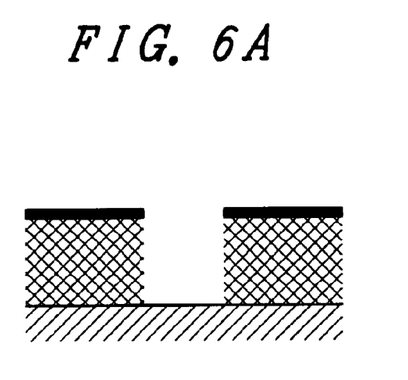
FIG. 6A is a diagram showing a cross section of a porous low-permittivity,material before an electron beam is applied by the existing method.
Figure 6B:
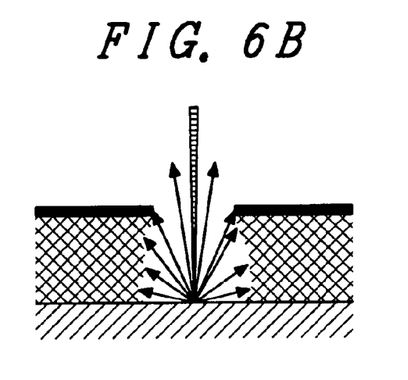
FIG. 6B is a diagram showing a cross section of the porous low-permittivity material to which an electron beam was applied by the existing method.
Figure 6C:
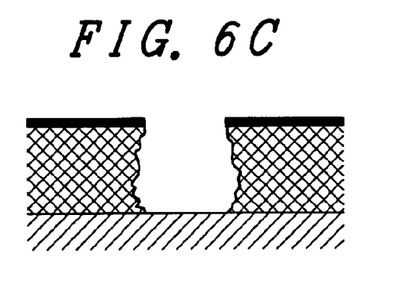
FIG. 6C is a diagram which shows the shrinkage of the porous low-permittivity material to which an electron beam was applied by a conventional method.

FIGS. 6A to 6C are directed to an observation of a cross-sectional profile of a sidewall of a bare hole, the sidewall being made of a low-permittivity material. The observation was made by an SEM (with low irradiation energy) before and after applying an electron beam to a wafer including a low-permittivity material as an inter-layer insulator film in its circuit pattern (bare hole), using the apparatus of FIG. 1 and the existing electron-beam method of inspecting circuit patterns. When an electron beam was applied by the existing method (irradiation energy was 800 eV) to the profile of the sidewall before the electron beam irradiation (FIG. 6A), a primary electron beam or a secondary signal therefrom enters the low-permittivity material of the sidewall (FIG. 6B), causing the material to shrink (FIG. 6C).

Figure 6D:
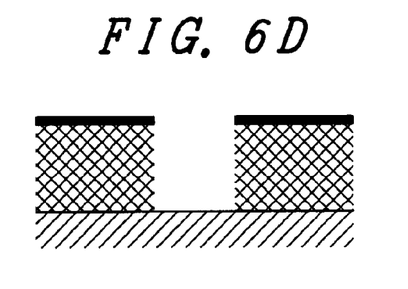
FIG. 6D is a diagram which shows a cross section of the same porous low-permittivity material to which an electron beam was applied by the method of the present invention.

On the other hand, when the measuring method of the present invention is used in the device of the first embodiment, shrinkage was hardly observed after the inspection of the same pattern (FIG. 6D).

Figure 7:
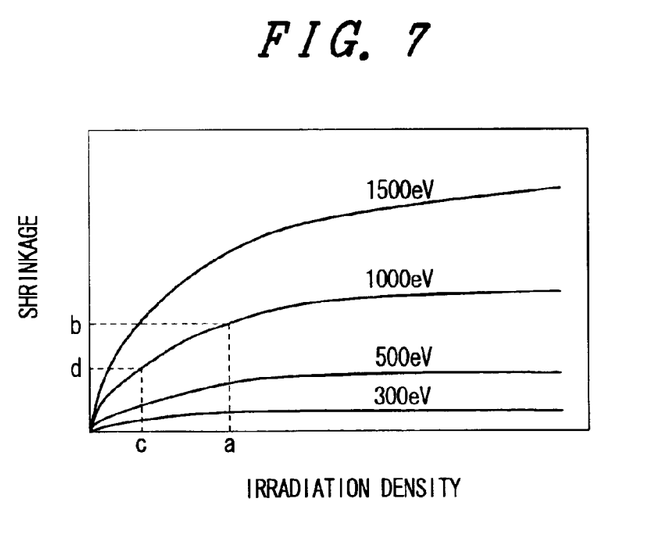
FIG. 7 is a graph which shows variations in shrinkage of a film according to the inspection method of the present invention and a conventional inspection method.

FIG. 7 shows, for each value of irradiation energy of the primary electron beam, the shrinkage of a porous HSQ film according to the change in irradiation density. It can be seen that the shrinkage of the film largely depends on the irradiation energy of the primary electron beam and tends to saturate as the irradiation density of the electron beam increases.

When an irradiation energy of 1,000 eV was applied to the porous HSQ film by the existing electron beam inspection method, at typical irradiation density "a," the shrinkage of the film was "b." On the other hand, when the measuring method of the present invention was used in the device of the first embodiment, since the allowable level "d" of shrinkage was set in advance, the inspection could be executed in such a way that the shrinkage of the film due to the inspection did not exceed "d" the irradiation density was "c" or lower. Further, the shrinkage of the film due to the inspection was reduced to "d" or less by setting the irradiation energy of the primary electron beam to 500 eV and 300 eV.

Figure 8:
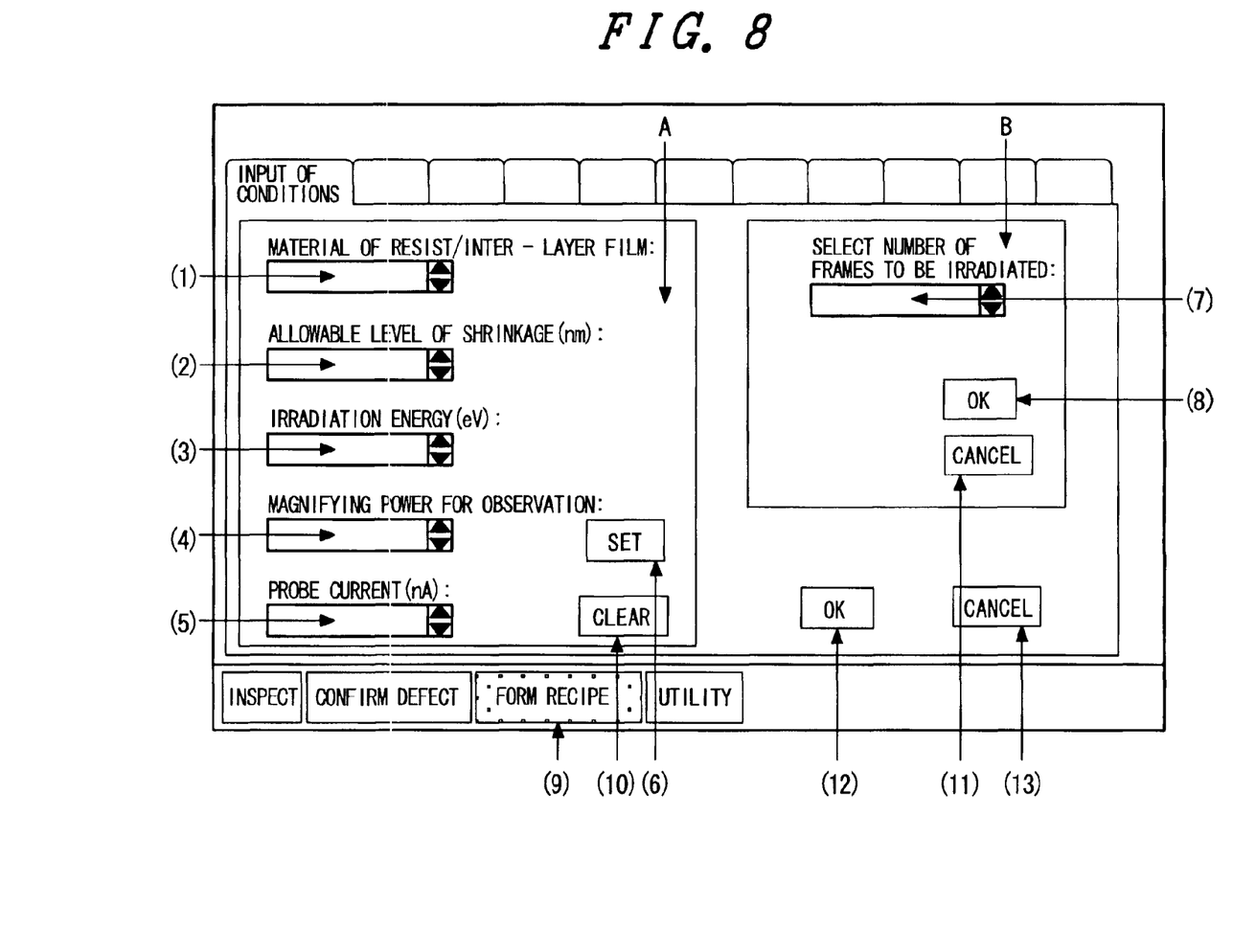
FIG. 8 is a diagram which illustrates an example of a specification screen of GUI command level functions in forming a recipe.

As an example of the inspection method according to the present invention, FIG. 8 shows a specification screen of GUI (Graphical User Interface) command level functions for setting the inspecting conditions when forming a recipe. On this screen, the names of parts and their functions are as follows.

(1) Component Box for selecting the kind of resist/low-permittivity material: Select the name of a resist/low-permittivity material to be hit by the electron beam on the semiconductor device to be inspected from among items in the component box.

(2) Component Box for selecting the shrinkage allowable level: Select the maximum value of shrinkage due to electron beam irradiation from among items in the component box in accordance with the specification of a semiconductor device.

(3) Component Box for selecting the electron-beam irradiation energy: Select the irradiation energy of the primary electron beam used in the inspection from among items in the component box.

(4) Component Box for selecting the magnifying power for observation: Select a scanning range (magnifying power for observation) of the primary electron beam in the inspection from among items in the component box.

(5) Component Box for selecting the probe current: Select the probe current value of the primary electron beam used in the inspection from among items in the component box.

(6) Set Button: When this button is pressed, inputted data in Steps (1)–(5) become effective, and the component box on the right for selecting the number of frames to be irradiated is enabled.

(7) Component Box for selecting the number of frames to be irradiated: Out of items in the component box, select the number of times of irradiation to each inspection area under inspection from among the available numbers of frames to be irradiated that are calculated in Step (6).

(8) OK Button: When this button is pressed, the inputted data in Step (7) becomes effective.

(9) Form Recipe Button: When this button is pressed, a screen for forming a recipe for the inspection is generated and displayed.

(10) Clear Button: When this button is pressed, the inputted data in Steps (1)–(5) are cleared and a reentrant procedure becomes possible.

(11) Cancel Button: When this button is pressed, even if the OK button (8) has already been pressed the inputted data in Step (7) is abandoned, and reselection becomes possible.

(12) OK Button: When this button is pressed, the contents that have been set in the regions A and B become effective, and the system goes to the next step of the recipe formation.

(13) Cancel Button: When this button is pressed, all the data inputted in the regions A and B are abandoned, which makes it possible to input conditions from scratch.

Action/processing and the contents of the processing are as follows:

1) Construction of recipe forming screen (9).

Contents of Processing: (a) Generate a screen, and (b) Enable region A of the screen for inputting conditions.

2) Input of inspecting conditions (1)–(6).

Contents of Processing: (a) Select the kind of resist or low-permittivity material in the semiconductor device, the allowable level for shrinkage of materials caused by the electron beam irradiation, the irradiation energy and probe current of the primary electron beam, and the magnifying power for scanning during the inspection. (b) Read data on the correlation between the conditions of irradiation of the electron beam stored in the device in advance and the shrinkage of the material to be inspected, calculate the number of frames in which the same inspection area can be irradiated during the inspection, and store such data in the storage. (c) Disable region A and enable region B.

3) Input the number of frames in which the same inspection area can be irradiated during inspection, (7)–(8), and (12).

Contents of Processing: (a) Input the number of irradiation frames calculated in Step 2) which are usable in the inspection. (b) Put away the screen for inputting conditions, and generate/display the next setting screen necessary for the inspection.

As described above in detail, according to the present invention, with respect to objects which have not been capable of measurement, such as a pattern on a semiconductor device including porous low-permittivity materials, such as an ArF resist material, a porous low-permittivity hidrogensilsesquiozane (HSQ) material and the like, damage-free or damage-reducing measurement in measuring the dimensions and shapes, detecting defects and reviewing features becomes possible. Thus, the damage to the semiconductor device due to the inspection itself can be minimized, information closer to the actual state of the semiconductor device can be obtained, and the inspection can be performed with higher precision and reliability by using an electron beam of low acceleration voltage.

What is claimed is:

1. A method of inspecting a board with a circuit pattern including at least a porous low-permittivity material or a material similar to it in terms of structure or composition, comprising the steps of:

scanning the circuit pattern with a primary electron beam;

detecting secondary electrons generated, or electrons reflected from the board due to the irradiation, or both the former and latter electrons, and converting the electrons into signals;

transforming the signals into an image, displaying the image, and inspecting circuit pattern; and reducing damage, including shrinkage to the circuit pattern by a primary electron beam by controlling the irradiation energy and density of the primary electron beam.

2. The method according to claim 1, wherein at least the areas of the circuit pattern to be exposed to the primary electron beam include at least a porous low-permittivity hydrogensilsesquioxane material or a material similar to it in terms of structure or composition.

3. The method according to claim 2, wherein the shrinkage of the circuit pattern due to the exposure to the primary electron beam is reduced to 2.4 nm or less by setting the irradiation energy of the primary electron beam to 300 eV or less.

4. The method according to claim 1, wherein the irradiation density of the primary electron beam is limited according to the irradiation energy of the primary electron beam and depending on the kind of said low-permittivity material or similar material.

5. The method according to claim 1, further comprising a step of recording the irradiation history of the board such as the irradiation energy, probe current, and irradiation density of the primary electron beam and the areas of the circuit pattern to be exposed to the primary electron beam.

6. The method according to claim 1, further comprising the steps of:

finding, in advance, for each material included in the board, the correlations between (i) parameters including the irradiation energy, probe current, and irradiation density of the primary electron beam and (ii) dimensional changes of the circuit pattern; and adjusting at least one of the parameters before the circuit pattern is scanned with the primary electron beam.

7. The method according to claim 1, wherein the irradiation density of the primary electron beam is controlled by (i) calculating, in advance, the maximum dose of irradiation per unit area in each area of the circuit pattern to be exposed to the primary electron beam and (ii) limiting the irradiation density of the primary electron beam below the maximum dose of irradiation in said area during the inspection of the board.

8. A method of inspecting a board with a circuit pattern including at least a porous low-permittivity material or a material similar to it in terms of structure or composition, comprising the steps of:

scanning the circuit pattern with a primary electron beam;

detecting secondary electrons generated, or electrons reflected from the board due to the irradiation, or both the former and latter electrons, and converting the electrons into signals;

transforming the signals into an image, displaying the image, and inspecting the circuit pattern and reducing the shrinkage of the circuit pattern due to the exposure to the primary electron beam to 2.4 nm or less by setting the irradiation energy of the primary electron beam to 300 eV or less.

9. The method according to claim 7, wherein at least the areas of the circuit pattern to be exposed to the primary electron beam include at least a porous low-permittivity hydrogensilsesquioxane material or a material similar to it in terms of structure or composition.

10. A method of inspecting a board with a circuit pattern including at least a porous low-permittivity hydrogensilsesquioxane material or a material similar to it in terms of structure or composition, comprising the steps of:

scanning the circuit pattern with a primary electron beam;

detecting the secondary electrons generated, or the electrons, reflected from the board due to the irradiation, or both the former and latter electrons and converting the electrons into signals;

transforming the signals into an image, displaying the image, and inspecting circuit pattern; and reducing the shrinkage of the circuit pattern due to the exposure to the primary electron beam to 2.4 nm or less by (i) setting the irradiation energy of the primary electron beam to 300 eV or less or (ii) setting the irradiation density of the primary electron beam to 1.4 $C/m^2$ or less if the irradiation energy of the primary electron beam is about 800 eV or more.

11. An apparatus for inspecting a board with a circuit pattern, at least the areas of the circuit pattern to be exposed to a primary electron beam including at least a porous low-permittivity hydrogensilsesquioxane material or a material similar to it in terms of structure or composition, the apparatus comprising:

means for scanning the circuit pattern with the primary electron beam;

means for detecting secondary electrons generated or electrons reflected from the board due to the irradiation or both the former and latter electrons and converting the electrons into signals; and means for transforming the signals into an image, displaying the image, and inspecting circuit pattern, damage including shrinkage to the circuit pattern by the primary electron beam being reduced by controlling the irradiation energy and density of the primary electron beam.

12. The apparatus according to claim 11, wherein the shrinkage of the circuit pattern due to the exposure to the primary electron beam is reduced to 2.4 nm or less by setting the irradiation energy of the primary electron beam to 300 eV or less.

* * * * *